(12) United States Patent
Chen et al.

(10) Patent No.: US 6,445,021 B1
(45) Date of Patent: Sep. 3, 2002

(54) NEGATIVE DIFFERENTIAL RESISTANCE REOXIDIZED NITRIDE SILICON-BASED PHOTODIODE AND METHOD

(75) Inventors: Fen Chen, Williston; Roger Aime Dufresne, Fairfax; Baozhen Li, South Burlington; Alvin Wayne Strong, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/665,913

(22) Filed: Sep. 20, 2000

(51) Int. Cl.$^7$ .............................................. H01L 27/148
(52) U.S. Cl. ....................... 257/233; 257/234; 257/251; 257/288; 257/292; 257/293
(58) Field of Search ................................. 257/233, 234, 257/257, 288, 292, 293

(56) References Cited

U.S. PATENT DOCUMENTS

| | | |
|---|---|---|
| 3,903,542 A | 9/1975 | Nathanson et al. |
| 4,127,932 A | 12/1978 | Hartman et al. |
| 4,148,052 A | 4/1979 | Nathanson et al. |
| 4,534,099 A | 8/1985 | Howe |
| 4,692,995 A * | 9/1987 | Blanchard |
| 4,742,027 A | 5/1988 | Blanchard et al. |
| 5,241,198 A | 8/1993 | Okada et al. |
| 5,302,545 A * | 4/1994 | Okada et al. |
| 5,654,565 A * | 8/1997 | Hokari |
| 6,130,422 A * | 10/2000 | Bawolek et al. |

OTHER PUBLICATIONS

Wu, et al., "Nitridation induced surface donor layer in silicon and its impact on the characteristics of n– and p–channel MOSFETs", Electron Devices Meeting, 1989, Technical Digest, International, pp. 271–274, (1989).

Lauinger et al., "UV stability of highest–quality plasma silicon nitride passivation of silicon solar cells," Photovoltaic Specialists Conference, 1996., Fifth IEEE, pp. 417–420, (1996).

Shiau, et al., "Reoxidized nitrided oxides as gate dielectrics for high temperature integrated sensor MOS devices", Solid–State Sensor and Actuator Workshop, 1988. Technical Digest, IEEE, pp. 100–101 (1988).

* cited by examiner

Primary Examiner—Fetsum Abraham
(74) Attorney, Agent, or Firm—Scully, Scott, Murphy & Presser; Lawrence R. Fraley

(57) ABSTRACT

A photodiode that exhibits a photo-induced negative differential resistance region upon biasing and illumination is described. The photodiode includes an N+ silicon substrate, a silicon nitride layer formed on the N+ silicon substrate, a reoxidized nitride layer formed on the silicon nitride layer and a N+ polysilicon layer formed on at least a portion of the reoxidized nitride layer.

10 Claims, 2 Drawing Sheets

NEGATIVE DIFFERENTIAL RESISTANCE REOXIDIZED NITRIDE SILICON-BASED PHOTODIODE AND METHOD

FIELD OF THE INVENTION

The present invention relates to a method of fabricating a photodiode and the photodiode produced therefrom. Specifically, the present invention is directed to a method of forming a photodiode wherein a layer of N+ polysilicon is formed over a dielectric multilayer of silicon nitride/reoxidized nitride, the silicon nitride layer of the multilayer having been formed on an N+ silicon substrate. A characteristic feature of the inventive photodiode is that on exposure to light photons and, while biasing the N+ silicon substrate positively with respect to the N+ polysilicon layer, the photodiode exhibits negative differential resistance (NDR).

BACKGROUND OF THE INVENTION

Silicon-based electronic components dominate integrated circuits (IC's) largely due to a mature and successful silicon processing technology. However, as the technology advances, and as the need for smaller, faster components increases, it is becoming increasingly desirable to combine silicon-based electronic components with silicon-based opto-electronic components to produce opto-electronic integrated circuits (OEIC's) utilizing existing silicon processing technology.

In OEIC technology, opto-electronic components such as photodiodes characterized by negative differential resistance (NDR) regions are of great interest as they offer a potential for high-speed, high-density and less complex OEIC's. NDR refers to the rate of change of current through a photodiode as the voltage changes across the diode, upon exposing the photodiode to light.

With their high switching speed and intrinsic binary on-off state, these photodiodes, when combined with other silicon-based electronic devices, potentially will provide highly compact, ultra-fast and low-cost OEIC's.

Although silicon-based photodiodes are known; see, for example, U.S. Pat. Nos. 4,148,052; 5,241,198; 4,742,027 and 4,534,099, a silicon-based photodiode utilizing a silicon nitride/reoxidized nitride dielectric that demonstrates NDR is not known.

Accordingly, in view of the potential advantages of such photodiodes with NDR characteristics for OIEC's, it is desirable to provide a photodiode which includes a silicon nitride/reoxidized nitride dielectric utilizing existing silicon-based processing technology.

SUMMARY OF THE INVENTION

One object of the present invention is to provide a photodiode that exhibits NDR characteristics.

Another object of the present invention is to provide a photodiode which includes a silicon nitride/reoxidized nitride dielectric.

A further object of the present invention is to provide a photodiode having the above characteristics utilizing existing silicon processing technology.

Specifically, and in one aspect of the present invention, a photodiode is provided that includes at least:

an N+ silicon substrate;
a layer of silicon nitride formed on said N+ silicon substrate;
a layer of reoxidized nitride formed on said silicon nitride layer; and
a layer of N+ polysilicon formed on at least a portion of said reoxidized layer, said photodiode exhibiting a negative differential resistance region upon biasing said N+ silicon substrate positively with respect to said N+ polysilicon layer and exposing said photodiode to illumination.

The present invention also provides a method of fabricating a photodiode with NDR characteristics, comprising the steps of:

(a) forming a silicon nitride layer on an N+ silicon substrate;

(b) forming a reoxidized layer on said silicon nitride layer; and (c) forming a layer of N+ polysilicon on at least a portion of said reoxidized layer so as to produce a photodiode, wherein said photodiode exhibits a negative differential resistance region upon biasing said N+ silicon substrate positively with respect to said N+ polysilicon layer and exposing said photodiode to illumination.

The present invention also provides an OEIC apparatus which includes at least the photodiode of the present invention as one of components of the OEIC apparatus.

DETAILED DESCRIPTION OF THE INVENTION

Figure 1:
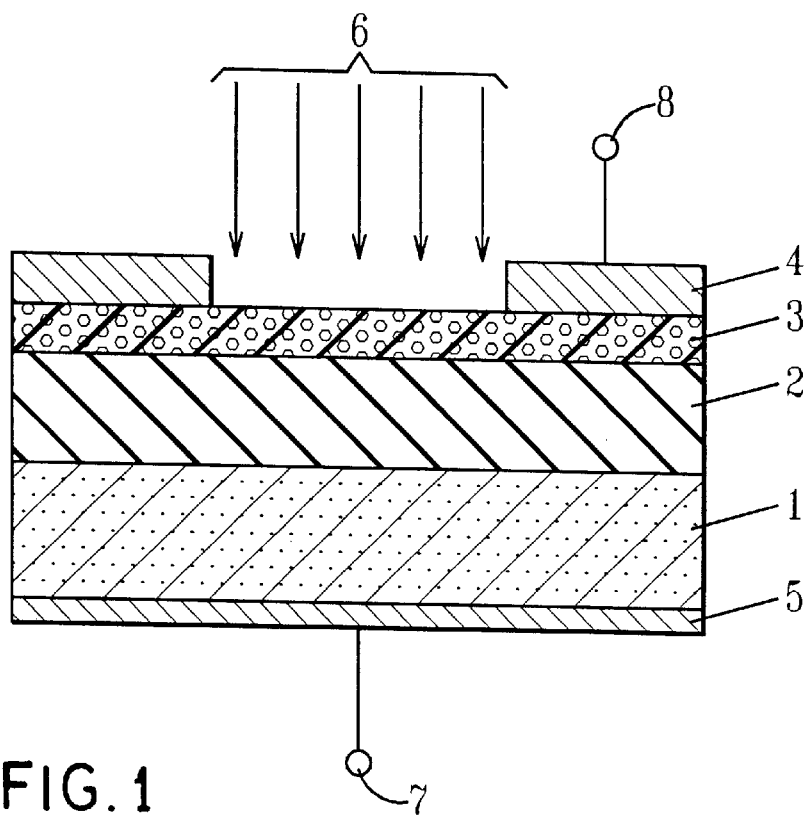
FIG. 1 illustrates a cross-section schematic of the photodiode of the present invention.

The present invention which is directed to a photodiode having NDR characteristics and a method of fabricating the same will now be described in more detail by referring to the drawings that accompany the present application.

Reference is first made to FIG. 1 which illustrates a schematic cross-section, not to scale, of the present photodiode. As illustrated, the photodiode comprises N+ silicon substrate 1, a layer of silicon nitride 2 formed on N+ silicon substrate 1, a layer of reoxidized nitride 3 formed on silicon nitride layer 2, and a layer of N+ polysilicon 4 formed on a portion of said reoxidized nitride layer 3. Supporting the N+ silicon substrate layer 1 is an Ohmic contact 5 that also serves as an electrode for positively biasing the N+ silicon substrate layer 1 with respect to the N+ polysilicon layer. Alternatively, the bias configuration could be negative on the N+ polysilicon layer.

In the inventive photodiode illustrated in FIG. 1, silicon nitride layer 2 has a thickness of less than about 5 nm and the reoxidized nitride 3 formed thereon has a thickness of from about 1 to 2 nm. As discussed below and with regard to FIGS. 2 and 3, on exposing the silicon nitride/reoxidized nitride layer 3 to photons 6, and on biasing the photodiode at electrodes 7, 8 the photodiode exhibits NDR characteristics. In FIG. 1, electrode 7 should always be biased with higher potential than electrode 8 in order to obtain NDR. Thus, electrode 7 may be positively biased and electrode 8 maybe grounded or negatively biased, or alternatively, electrode 7 may be grounded and electrode 8 is negatively biased.

Also with reference to FIG. 1, the method of the invention is described. As a first step, a silicon substrate is doped to form N+ silicon substrate 1. This step, as is well known in the art, includes preparing a semiconductor substrate suitable for integrated circuit fabrication and doping the substrate by well known doping techniques such as by out diffusion from an N− type doped glass material or ion implantation utilizing an N− type dopant such as arsenic or phosphorus, to form the N+ silicon substrate. Alternatively, one could use a N+ substrate which requires no doping.

Optionally, and prior to forming the silicon nitride layer on the N+ silicon substrate, the substrate may be precleaned using a conventional Huang-type precleaning process.

Next, a layer of silicon nitride (SiN) 2 is formed on N+ silicon substrate 1 by nitriding the surface of the silicon substrate by techniques well known in the art. That is, silicon nitride layer may be formed, for example, by thermally growing a silicon nitride film on the substrate using a conventional in-situ growing process which includes:

(i) removing any native oxide from the N+ silicon substrate by prebaking at a temperature of about 950° C. for about 30 minutes in the presence of a reducing atmosphere, e.g., $H_2$;

(ii) heating the N+ silicon substrate of step (i) in $NH_3$ at a temperature of about 950° C. to form a SiN nucleation layer having a thickness of from about 20 to about 25 Å on the N+ silicon substrate; and (iii) depositing a SiN layer on said SiN nucleation layer by low pressure chemical vapor deposition (LPCVD) using dichlorosilane and $NH_3$ as reactant gases. The LPCVD step, i.e., step (iii), which is typically conducted at a temperature of from about 650° to about 750° C., serves to grow the bulk of the SiN layer on the N+ substrate.

The layer of silicon nitride formed using the above processing steps typically has a thickness of about 5 nm. Other thicknesses for the silicon nitride layer as well as the other layers of the inventive photodiode besides those mentioned herein are also possible.

Next, a reoxidized nitride layer 3 is formed on silicon nitride 2, using techniques well known in the art. For example, this reoxidized nitride layer is formed by exposing nitride layer 2 to steam or another wet ambient at a temperature of about 900° C. The reoxidized layer formed from this reoxidization step typically has a thickness of from about 1 to about 2 nm.

A layer of N+ polysilicon partially or entirely covering the reoxidized nitride layer is thereafter formed on the reoxidized nitride layer. A partial N+ polysilicon layer is preferred herein since it provides better signal. As in the previous steps, the N+ polysilicon layer is formed by techniques well known in the art including optionally using a masking layer to define the portion of the reoxidized layer not to be covered and using an in-situ doping deposition process to form the N+ polysilicon layer on the reoxidized nitride layer. Alternatively, the N+ polysilicon layer may be formed by deposition and ion implantation. The N+ polysilicon layer formed in this step of the present invention typically has a thickness of about 3000 Å.

Figure 2:
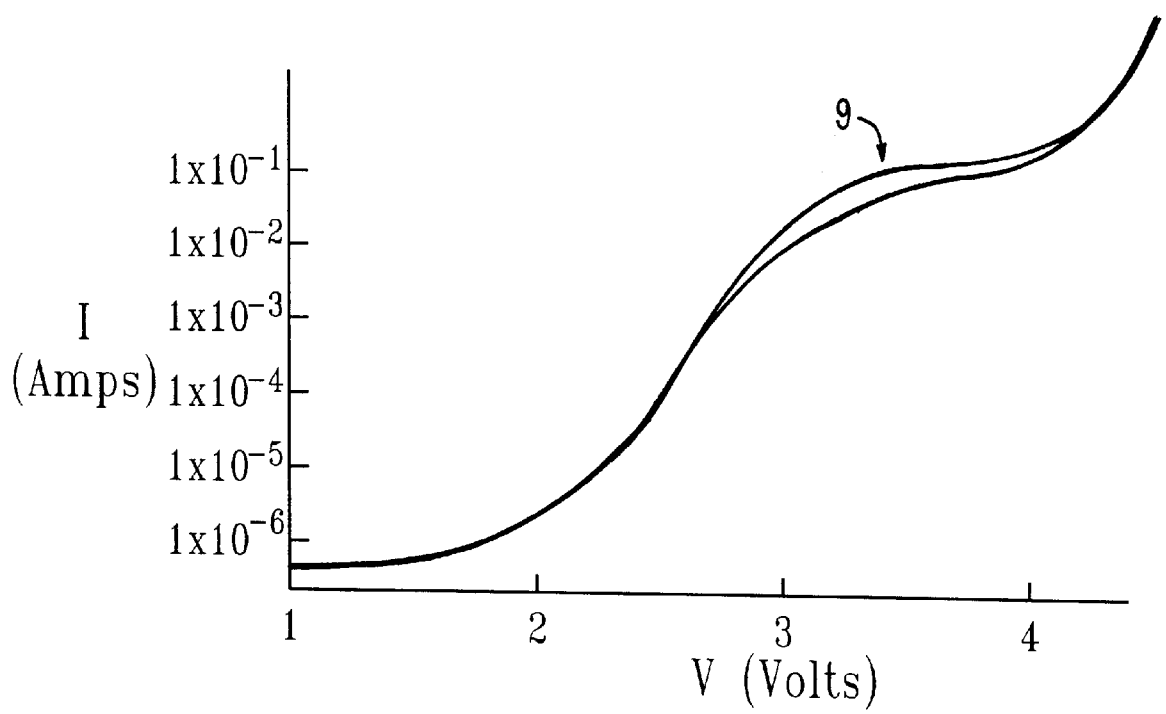
FIG. 2 is a graph of current (I) vs. voltage (V) characteristics of the photodiode of the present invention at two different light intensities.
Figure 3:
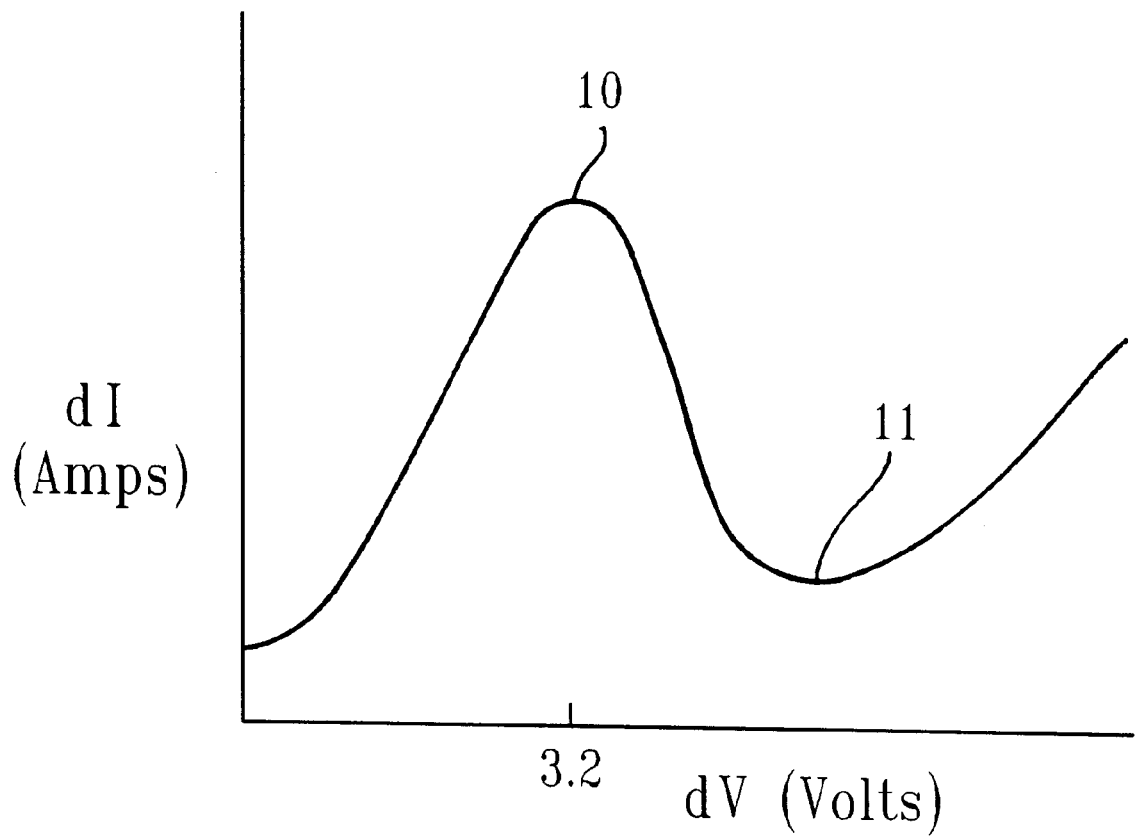
FIG. 3 is a graph depicting negative differential resistance (dI vs. dV) characteristics of the photodiode of the present invention.

The NDR characteristic of the present photodiode under light illumination, e.g., mercury vapor lamp or W lamp illumination, and under negative N+ polysilicon bias at room temperature is shown in FIGS. 2 and 3 of the present application. As illustrated in FIG. 2, a graphical plot 9 of current density, $A/cm^2$, (I), versus absolute N+ polysilicon voltage (V), (not to scale), shows a NDR region at about 3.2 V, for both positive and negative gate bias polarities and dark current-voltage at room temperature. It is noted that the two different I-V curves shown in FIG. 2 are due to two different light intensities. Higher light intensities typically provide more NDR.

It should be noted that the voltage reported above varies with different SiN/reoxidized nitride thicknesses and that the NDR region is exhibited at room temperature. Furthermore, the NDR of the invention photodiode may be enhanced by increasing the illumination intensity.

Similarly, a graphical plot 10 of the rate of change of current (I) versus voltage (V), as illustrated in FIG. 3, shows an NDR peak 10 and valley 11. In the inventive photodiode, no NDR region is observed for a positive N+ polysilicon bias and the current increases with increasing photo-illumination intensity under gate injection. Furthermore, the current is independent, or even slightly decreases, with increasing photoillumination intensity under positive gate injection.

It should be noted that the above techniques and ranges are exemplary and that other techniques and ranges which are well known to those skilled in the art can also be employed in fabricating the inventive photodiode.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A photodiode comprising:

an N+ silicon substrate;

a layer of silicon nitride formed on said N+ silicon substrate;

a layer of reoxidized nitride formed on said silicon nitride layer; and a layer of N+ polysilicon formed on at least a portion of said reoxidized layer, said photodiode exhibiting a negative differential resistance region upon biasing said N+ silicon substrate positively with respect to said N+ polysilicon layer and exposing said photodiode to illumination.

2. The photodiode of claim 1, wherein said silicon nitride layer has a thickness of less than about 5 nm.

3. The photodiode of claim 1, wherein said reoxidized layer has a thickness of from about 1 to about 2 nm.

4. The photodiode of claim 1, wherein said negative differential resistance region has a voltage of about 3.2 V which varies depending on the thickness of said silicon nitride and reoxidized nitride layer.

5. The photodiode of claim 1, wherein said negative differential resistance region is exhibited at room temperature.

6. The photodiode of claim 1, wherein said negative differential resistance is enhanced by increasing said illumination.

7. The photodiode of claim 6, wherein said negative differential resistance has a peak-to-valley ratio that increases with illumination intensity.

8. The photodiode of claim 1 further comprising an Ohmic contact formed on an exposed surface of said N+ substrate.

9. The photodiode of claim 8 further comprising a first electrode connected to said Ohmic contact and a second electrode connected to said N+ polysilicon layer.

10. An apparatus embodying a photodiode, said photodiode comprising:
 a layer of silicon nitride formed on an N+ silicon substrate;
 a layer of reoxidized nitride formed on said silicon nitride layer; and
 a layer of N+ polysilicon formed on at least a portion of said reoxidized layer, said photodiode exhibiting a photo-induced negative differential resistance region upon biasing said N+ silicon substrate positively with respect to said N+ polysilicon layer and exposing said photodiode to illumination.

* * * * *